United States Patent
Prentice et al.

(10) Patent No.: US 11,246,249 B2
(45) Date of Patent: Feb. 8, 2022

(54) TILT AND ROTATE DISPENSER HAVING STRAIN WAVE GEAR SYSTEM

(71) Applicant: Illinois Tool Works Inc., Glenview, IL (US)

(72) Inventors: Thomas C. Prentice, Westford, MA (US); Fernando J. Aguiar, Westport, MA (US); Scott A. Reid, Bradford, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 16/849,249

(22) Filed: Apr. 15, 2020

(65) Prior Publication Data
US 2021/0329820 A1 Oct. 21, 2021

(51) Int. Cl.
| | | |
|---|---|---|
| *H05K 13/04* | (2006.01) | |
| *B05C 5/02* | (2006.01) | |
| *B05B 3/02* | (2006.01) | |
| *B05C 13/00* | (2006.01) | |
| *H05K 3/12* | (2006.01) | |
| *H01L 21/67* | (2006.01) | |

(52) U.S. Cl.
CPC ........... *H05K 13/0469* (2013.01); *B05B 3/02* (2013.01); *B05C 5/0225* (2013.01); *B05C 13/00* (2013.01); *H05K 3/1241* (2013.01); *H01L 21/6715* (2013.01); *H05K 2203/0126* (2013.01)

(58) Field of Classification Search
USPC .................. 118/305, 321, 323, 500, 679–681
See application file for complete search history.

(56) References Cited

U.S. PATENT DOCUMENTS

| | | | |
|---|---|---|---|
| 2003/0105603 A1* | 6/2003 | Hardesty | G05B 19/401 702/95 |
| 2004/0089228 A1* | 5/2004 | Prentice | H01L 21/6715 118/300 |
| 2009/0317554 A1 | 12/2009 | Christensen et al. | |
| 2013/0247716 A1* | 9/2013 | Takahashi | F16H 49/001 74/640 |
| 2018/0272490 A1* | 9/2018 | Brenner | F16F 7/04 |

OTHER PUBLICATIONS

Notification of Transmittal of the International Search Report and the Written Opinion of the International Searching Authority from corresponding PCT/US2021/022149 dated Jun. 28, 2021.

* cited by examiner

*Primary Examiner* — Yewebdar T Tadesse
(74) *Attorney, Agent, or Firm* — Lando & Anastasi, LLP

(57) ABSTRACT

A dispensing system includes a dispensing unit assembly configured to dispense viscous material and a gantry coupled to the frame. The gantry is configured to support the dispensing unit assembly and to move the dispensing unit assembly in x-axis and y-axis directions. The dispensing unit assembly includes a support bracket secured to the gantry and a movable bracket rotatably coupled to the support bracket by a first strain wave gear system configured to enable the rotation of the movable bracket with respect to the support bracket about a first axis. The dispensing unit assembly further includes a dispensing unit rotatably coupled to the movable bracket by a second strain wave gear system configured to enable the rotation of the dispensing unit with respect to the movable bracket about a second axis generally perpendicular to the first axis.

13 Claims, 10 Drawing Sheets

TILT AND ROTATE DISPENSER HAVING STRAIN WAVE GEAR SYSTEM

BACKGROUND OF THE DISCLOSURE

1. Field of the Disclosure

This disclosure relates generally to apparatus and methods for dispensing a viscous material on a substrate, such as a printed circuit board, and more particularly to a method and an apparatus for dispensing material on a substrate with a mechanism configured to tilt and rotate a dispensing unit.

2. Discussion of Related Art

There are several types of dispensing systems used for dispensing precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto printed circuit boards. Automated dispensing systems are also used for dispensing lines of underfill materials and encapsulants, which may be used to mechanically secure components to the printed circuit board. Exemplary dispensing systems described above include those manufactured and distributed by Illinois Tool Works Electronic Assembly Equipment (ITWEAE), with offices at Hopkinton, Mass.

In a typical dispensing system, a dispensing unit is mounted to a moving assembly or gantry for moving the dispensing unit along three mutually orthogonal axes (x-axis, y-axis, and z-axis) using servomotors controlled by a computer system or controller. To dispense a dot of liquid on a printed circuit board or other substrate at a desired location, the dispensing unit is moved along the co-planar horizontal x-axis and y-axis directions until the dispensing unit is located over the desired location. The dispensing unit is then lowered along the perpendicularly oriented vertical z-axis direction until a nozzle/needle of the dispensing unit and dispensing system is at an appropriate dispensing height over the substrate. The dispensing unit dispenses a dot of liquid, is then raised along the z-axis, moved along the x- and y-axes to a new location, and is lowered along the z-axis to dispense the next liquid dot. For applications such as encapsulation or dispensing of underfill as described above, the dispensing unit is typically controlled to dispense lines of material as the dispensing unit is moved in the x- and y-axes along the desired path of the lines. For some types of dispensing units, such as jetting pumps, the z-axis movement prior to and subsequent to a dispense operation may not be required.

Greater control of the dispensing unit to accurately place dispensed material closer to a corner where a component edge meets the substrate or other space/orientation that requires such motion is desired.

SUMMARY OF THE DISCLOSURE

One aspect of the present disclosure is directed to a dispensing system for dispensing viscous material on an electronic substrate. In one embodiment, the dispensing system comprises a frame and a support coupled to the frame. The support is configured to receive and support an electronic substrate during a dispense operation. The dispensing system further comprises a dispensing unit assembly configured to dispense viscous material and a gantry coupled to the frame. The gantry is configured to support the dispensing unit assembly and to move the dispensing unit assembly in x-axis and y-axis directions. The dispensing unit assembly includes a support bracket secured to the gantry and a movable bracket rotatably coupled to the support bracket by a first strain wave gear system configured to enable the rotation of the movable bracket with respect to the support bracket about a first axis. The dispensing unit assembly further includes a dispensing unit rotatably coupled to the movable bracket by a second strain wave gear system configured to enable the rotation of the dispensing unit with respect to the movable bracket about a second axis generally perpendicular to the first axis.

Embodiments of the dispensing system further may include configuring the movable bracket is configured to rotate with respect to the support bracket up to an entire 360 degrees and the dispensing unit is configured to rotate with respect to the movable bracket up to an entire 360 degrees. The second strain wave gear system may include a mounting plate configured to receive and support the dispensing unit. The support bracket may be L-shaped in construction having a first portion coupled to the gantry and a second portion that extends perpendicularly from the first portion. The second portion of the support bracket may support the first strain wave gear system. The gantry may include a beam configured to move in a y-axis direction, and a carriage coupled to the beam, the carriage being configured to move in an x-axis direction. The carriage may include a z-axis drive mechanism, with the first portion of the support bracket being secured to the z-axis drive mechanism to provide z-axis movement of the dispensing unit. Each of the first strain wave gear system and the second strain wave gear system may include a housing, a circular spine supported by the housing, a wave generator supported by the housing, the wave generator being positioned within the circular spine, a flexible spline having a spline portion disposed between the circular spine and the wave generator and a base portion extending from the spline portion, and a mounting hub secured to the base portion of the flexible spline. The housing may be configured to support a motor to drive the rotation of the components of the strain wave gear system. The housing of the first strain wave gear system may be secured to the second portion of the support bracket and the housing of the second strain wave gear system is secured to the movable bracket. The dispensing system further may include a vision system coupled to one of the frame and the gantry to capture at least one image of the electronic substrate. The dispensing system further may include a controller configured to control dispensing unit assembly, the gantry and the vision system to perform a dispense operation on the electronic substrate. The first strain wave gear system and the second strain wave gear system may be coupled to a controller of the dispensing system to control the operation of the first and second strain wave gear systems.

Another aspect of the present disclosure is directed to a method of dispensing viscous material on an electronic substrate. In one embodiment, the method comprises delivering an electronic substrate to a dispense position, capturing at least one image of the electronic substrate, analyzing the at least one image of the electronic substrate to determine a position of the electronic substrate, and performing a dispense operation by rotating a dispensing unit coupled to a support bracket by a movable bracket. The movable bracket is rotatably coupled to the support bracket by a first strain wave gear system configured to enable the rotation of the movable bracket with respect to the support bracket about a first axis. The dispensing unit is rotatably coupled to the movable bracket by a second strain wave gear system configured to enable the rotation of the dispensing unit with respect to the movable bracket about a second axis generally perpendicular to the first axis.

Embodiments of the method further may include configuring the movable bracket to rotate with respect to the support bracket up to an entire 360-degrees and the dispensing unit to rotate with respect to the movable bracket up to an entire 360 degrees. The support bracket may be L-shaped in construction having a first portion coupled to the gantry and a second portion that extends perpendicularly from the first portion. The second portion of the support bracket may support the first strain wave gear system. The gantry may include a beam configured to move in a y-axis direction and a carriage coupled to the beam. The carriage may be configured to move in an x-axis direction. The carriage may include a z-axis drive mechanism, with the first portion of the support bracket being secured to the z-axis drive mechanism to provide z-axis movement of the dispensing unit. Each of the first strain wave gear system and the second strain wave gear system may include a housing, a circular spine supported by the housing, a wave generator supported by the housing, the wave generator being positioned within the circular spine, a flexible spline having a spline portion disposed between the circular spline and the wave generator and a base portion extending from the spline portion, and a mounting hub secured to the base portion of the flexible spline. The first strain wave gear system and the second strain wave gear system may be coupled to a controller of the dispensing system to control the operation of the first and second strain wave gear systems.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION OF THE DISCLOSURE

Figure 1:
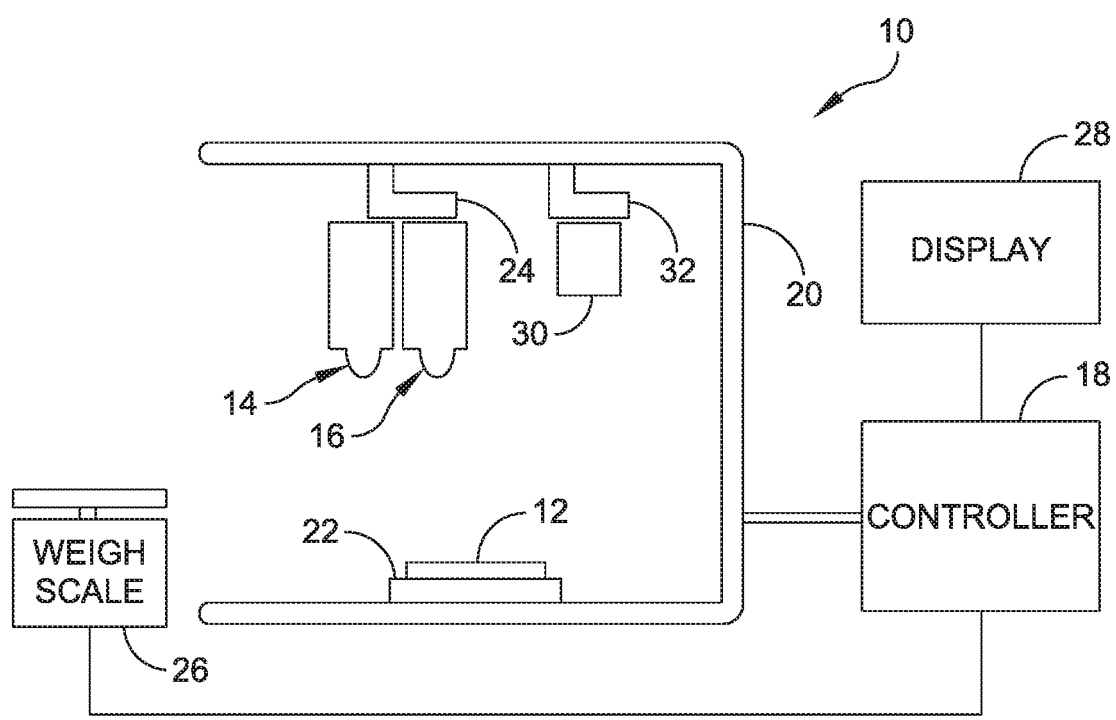
FIG. 1 is a schematic view of a dispensing system.

Various embodiments of the present disclosure are directed to viscous material dispensing systems, devices including dispensing systems. Embodiments disclosed herein are directed to techniques for dispensing material on an electronic substrate by a dispensing system having a dispensing unit that is configured to tilt and rotate to dispense material onto the electronic substrate.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

FIG. 1 schematically illustrates a dispensing system, generally indicated at 10, according to one embodiment of the present disclosure. The dispensing system 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispensing system 10 may alternatively be used in other applications, such as for applying automotive gasketing material or in certain medical applications or for applying conductive inks. It should be understood that references to viscous or semi-viscous materials, as used herein, are exemplary and intended to be non-limiting. In one embodiment, the dispensing system 10 includes first and second dispensing units, generally indicated at 14 and 16, respectively, and a controller 18 to control the operation of the dispensing system. It should be understood that dispensing units also may be referred to herein as dispensing pumps and/or dispensing heads. Although two dispensing units are shown, it should be understood that a single dispensing unit or multiple dispensing can be employed.

The dispensing system 10 may also include a frame 20 having a base or support 22 for supporting the electronic substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispensing system 10 to control loading and unloading of electronic substrates to and from the dispensing system. The gantry 24 can be moved using motors under the control of the controller 18 to position the dispensing units 14, 16 at predetermined locations over the electronic substrate. The dispensing system 10 may include a display unit 28 connected to the controller 18 for displaying various information to an operator. There may be an optional second controller for controlling the dispensing units. Also, each dispensing unit 14, 16 can be configured with a z-axis sensor to detect a height at which the dispensing unit is disposed above the electronic substrate 12 or above a feature mounted on the electronic substrate. The z-axis sensor is coupled to the controller 18 to relay information obtained by the sensor to the controller.

Prior to performing a dispensing operation, as described above, the electronic substrate, e.g., the printed circuit board, must be aligned or otherwise in registration with a dispensing unit of the dispensing system. The dispensing system further includes a vision system 30, which, in one embodiment, is coupled to a vision system gantry 32 movably coupled to the frame 20 for supporting and moving the vision system. In another embodiment, the vision system 30 may be provided on the dispensing unit gantry 24. As described, the vision system 30 is employed to verify the location of landmarks, known as fiducials, or components on the electronic substrate. Once located, the controller can be programmed to manipulate the movement of one or more of the dispensing units 14, 16 to dispense material on the electronic substrate.

Systems and methods of the present disclosure are directed to dispensing material onto an electronic substrate, e.g., a printed circuit board. The description of the systems and methods provided herein reference exemplary electronic substrates 12 (e.g., printed circuit boards), which are supported on the support 22 of the dispensing system 10. In one embodiment, the dispense operation is controlled by the controller 18, which may include a computer system configured to control material dispensing units. In another embodiment, the controller 18 may be manipulated by an operator. The controller 18 is configured to manipulate the movement of the vision system gantry 32 to move the vision system so as to obtain one or more images of the electronic substrate 12. The controller 18 further is configured to manipulate the movement of the dispensing unit gantry 24 to move the dispensing units 14, 16 to perform dispensing operations.

Embodiments of the present disclosure are directed to a strain wave gear drive assembly that is configured to tilt and rotate a dispensing unit of a dispensing system. offer alternative and competitive means to accurately dispense simultaneously on one or more electronic substrates or two or more patterns associated with a single electronic substrate. The methods disclosed herein further support the use of various types of dispensing units, including, but not limited to, auger, piston and jetting pumps.

Figure 2:
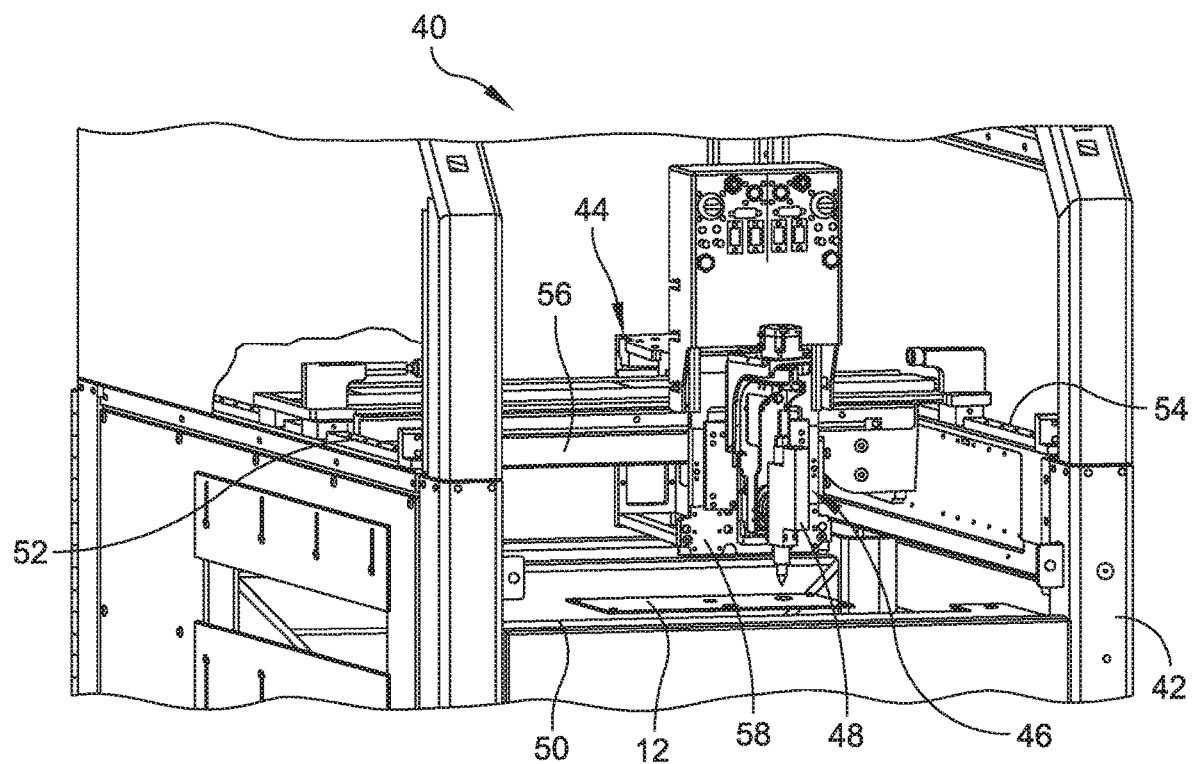
FIG. 2 is a perspective view of a dispensing system with packaging removed to disclose a dispensing system configured to manipulate a single dispensing unit.
Figure 3:
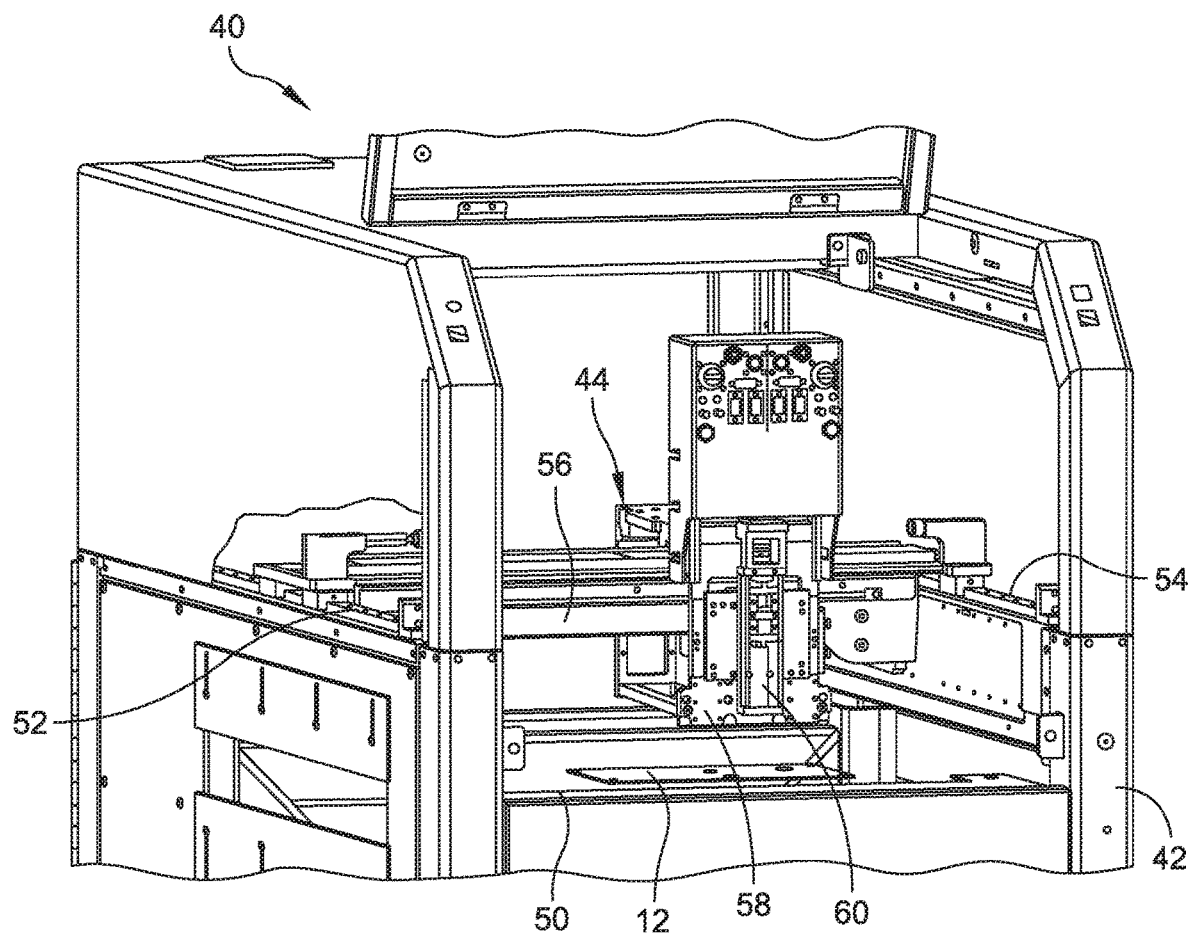
FIG. 3 is a perspective view of the dispensing system shown in FIG. 2 with the dispensing unit removed.

Referring to FIGS. 2 and 3, a dispensing system is generally indicated at 40. As shown, the dispensing system 40 includes a frame 42 configured to support the major sub-assemblies of the dispensing system. The dispensing system 40 further includes a gantry system, generally indicated at 44, which is configured to move in x-axis and y-axis directions. The dispensing system 40 further includes a dispensing unit assembly, generally indicated at 46, which is supported by the gantry system 44. FIG. 2 illustrates the dispensing system 40 having the dispensing unit assembly 46 and FIG. 3 illustrates the dispensing system 40 with the dispensing unit assembly removed. A conveyor system (not shown) may be used in the dispensing system 40 to control loading and unloading of substrates, e.g., electronic substrate 12, to and from a support 50 of the dispensing system. The gantry system 44 can be moved using motors under the control of a controller, in a manner similar to controller 18 of dispensing system 10, in the x-axis and y-axis directions to position the dispensing unit assembly 46 at predetermined locations over the electronic substrate.

In one embodiment, as shown in FIGS. 2 and 3, the gantry system 44 may be configured to include a left-hand side rail 52, a right-hand side rail 54, and a beam 56 that extends between the two side rails. The beam 56 is configured to move in a y-axis direction along the side rails 52, 54 to achieve y-axis movement of the dispensing unit assembly 46. The gantry system 44 further includes a carriage 58 that is coupled to the beam 56 and configured to move along a length of the beam to provide x-axis movement of the dispensing unit assembly 46. Specifically, the carriage 58 supports the dispensing unit assembly 46, and is configured to move along the length of the beam in the x-axis direction to move the dispensing unit 48 over desired locations of the electronic substrate 12 positioned on the support 50 of the dispensing system 40. In a certain embodiment, movement of the gantry system 44 (i.e., movement of the beam 56 and the carriage 58) in the x-y plane may be achieved by employing ball screw mechanisms driven by respective motors as is well known in the art.

In one embodiment, an exemplary dispensing system described herein may embody Camalot® dispensing systems sold by ITWEAE of Hopkinton, Mass.

The dispensing unit assembly 46 is configured to move the dispensing unit 48 in a z-axis direction by a z-axis drive mechanism 60, which is shown in FIG. 2. The amount of z-axis movement may be determined by measuring the distance between the tip of a needle (not shown) of the dispensing unit 48 and the electronic substrate 12. When moving, the dispensing unit 48 may be positioned at a nominal clearance height above the electronic substrate 12. The clearance height may be maintained at a relatively consistent elevation above the electronic substrate 12 when moving from one dispense location to another dispense location. Upon reaching a predetermined dispense location, the z-axis drive mechanism 60 lowers the dispensing unit 48 to the electronic substrate 12 so that dispensing of material on the electronic substrate may be achieved.

Still referring to FIGS. 2 and 3, the dispensing unit 48 is moved over the electronic substrate 12 in such a manner to perform a dispense operation with the dispensing unit. However, prior to dispensing, the position of the electronic substrate 12 with respect to the dispensing unit 48 is determined so that accurate dispensing may take place. Specifically, in one embodiment, the carriage 58 can be configured to include an optical element or camera that is designed to take an image of the electronic substrate 12. Although the camera is described to be mounted on the carriage 58, it should be understood that the camera may be separately mounted on the beam 56 or on an independent gantry. The camera may be referred to herein as a "vision system" or an "imaging system." To align the electronic substrate 12 with the dispensing unit 48 and gantry system 44, images of at least two fiducials provided on the electronic substrate 12 are taken by the camera. If the electronic substrate 12 is out of position, the gantry system 44 may be manipulated to account for the actual position of the electronic substrate. In one embodiment, the camera may be calibrated to determine a camera-to-needle offset distance for the dispensing unit 48.

In another embodiment, vision alignment and clearance height sensing can be achieved with a laser or another calibrated distance measurement device.

A dispensing system typically has a dispensing unit oriented vertically and thus perpendicular to a horizontally fixtured substrate. In some applications, it is advantageous to tip the dispensing unit away from the vertical to deposit material being dispensed in a location that would otherwise be inaccessible from the vertical orientation. As the tilted dispensing unit is articulated to various desired orientations, it may also be advantageous to change not only the angle of the dispensing unit from the vertical, but also the direction in which the dispensing unit is tilted, perhaps to deposit material at the bottom edge of a part along more than one side.

As will be appreciated by those familiar with moving structures, the mechanisms utilized to tilt and rotate the dispensing unit 48 add mass and reduce the structural stiffness, since any added mechanism introduces addition compliance. As the supported mass is increased and the stiffness of the structure is reduced, the natural frequency of the assembly is lowered. Accordingly, it is incumbent upon the designer to provide the necessary degrees of freedom with a minimum of added mass and as stiff as structure as possible.

Embodiments of the dispensing system 40 of the present disclosure accomplish this goal by incorporating a very compact and highly integrated rotary actuator, such as those available from Harmonic Drive of Beverly, Mass., that includes a motor, a strain-wave harmonic reduction gear box and a very stiff rotary cross-roller bearing. The high level of integration in the strain-wave gear-box actuator serves to minimize added mass and compliance. The strain-wave gear-box further has the benefit of extremely low backlash. Also, the integrated motor, bearing and gear-box assembly serves to minimize the number of parts that must be purchased, assembled and tested.

Figure 4:
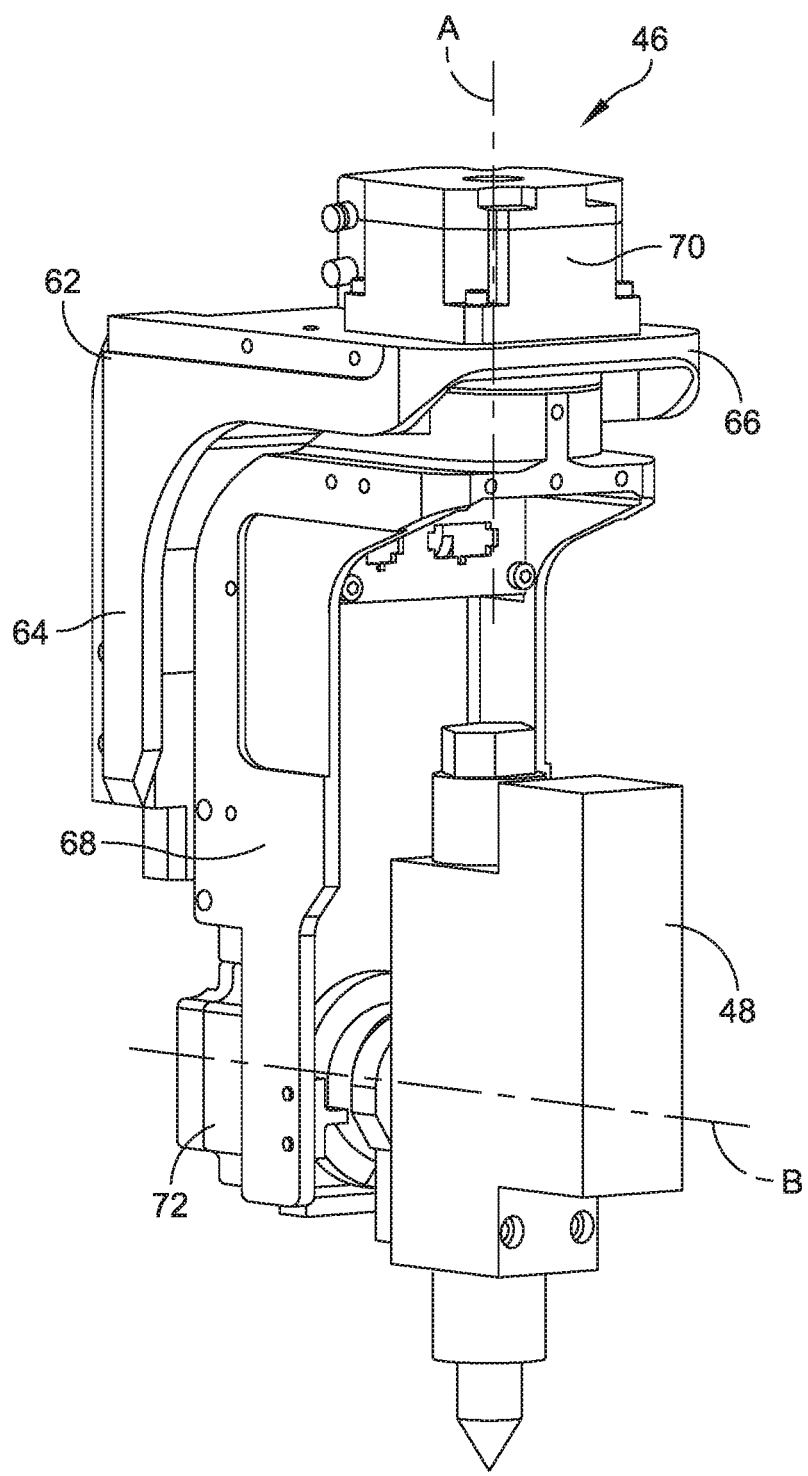
FIG. 4 is an enlarged perspective view of the dispensing system.
Figure 5:
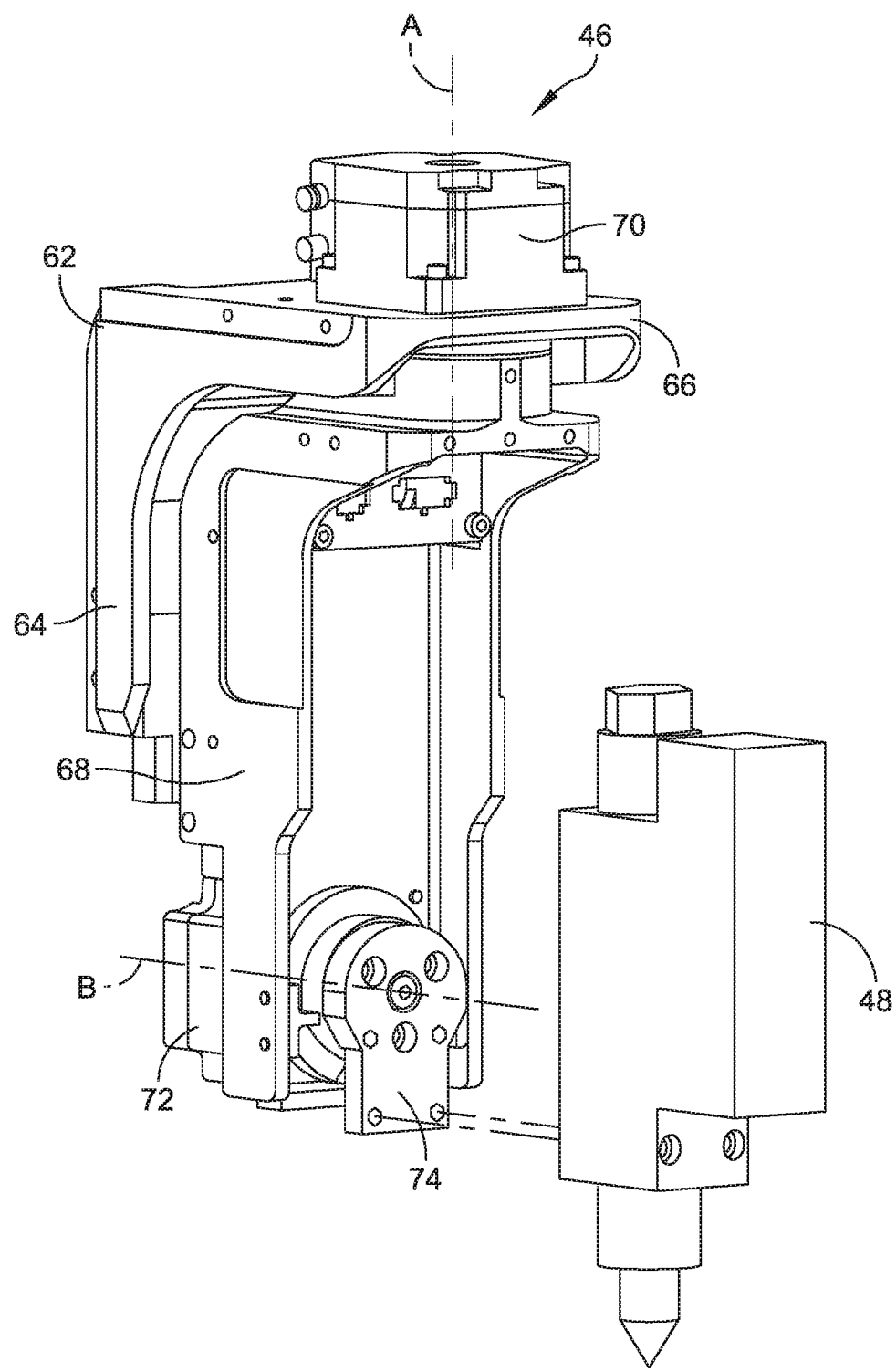
FIG. 5 is an enlarged perspective view of the dispensing system shown in FIG. 4 with the dispensing unit spaced from the remaining components of the dispensing system.

Referring to FIGS. 4 and 5, the dispensing unit assembly 46 includes a drive assembly configured to support the dispensing unit 48, which is shown in an operational position in FIG. 4 and a pre-operational position in FIG. 5 in which the dispensing unit is spaced from the components of the dispensing unit assembly configured to support the dispensing unit. As shown, the dispensing unit assembly 46 includes a support bracket 62 having an L-shaped construction in which a first portion 64 of the support bracket is secured to the z-axis drive mechanism 60 of the carriage 58 and a second portion 66 that extends perpendicularly from the first portion. The dispensing unit assembly 46 further includes a movable bracket 68 that is rotatably coupled to the support bracket 62 at the second portion 66 of the support bracket by a first strain wave gear system 70. In the shown embodiment, the movable bracket 68 is configured to rotate with respect to the support bracket 62 about a generally vertical axis A.

The movable bracket 68 includes a second strain wave gear system 72 that is configured to support the dispensing unit 48. As shown, the second strain wave gear system 72 includes a mounting plate 74 that is configured to receive and support the dispensing unit 48 when the dispensing unit is in its operational position. The second strain wave gear system 72 is configured to rotate and tilt the dispensing unit 48 to a desired position during a dispense operation about an axis B, which is generally perpendicular to axis A. In one embodiment, the first strain wave gear system 70 is similarly if not identically constructed as the second strain wave gear system 72.

It should be understood that the orientation of the movable bracket 68 with respect to the support bracket 62 about axis A and the orientation of the dispensing unit 48 with respect to the movable bracket can be varied to accommodate a particular application. For example, the movable bracket 68 can be rotatably coupled to the support bracket 62 about a generally horizontal axis and the dispensing unit can be rotatably coupled to the movable bracket about a generally vertical axis.

Figure 6:
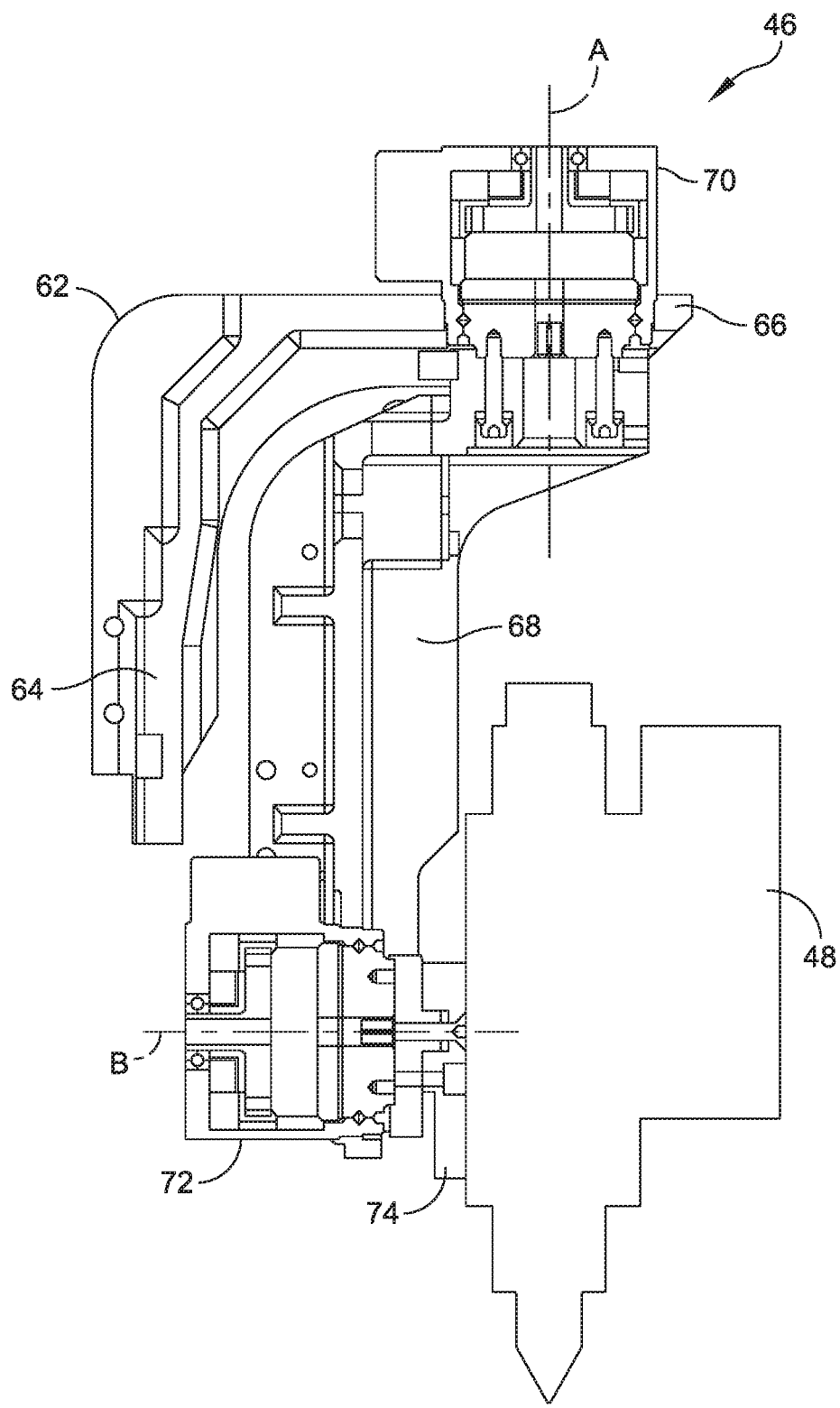
FIG. 6 is cross sectional view of the dispensing system.

FIG. 6 illustrates a cross-sectional view of the dispensing unit assembly 46 showing the first strain wave gear system 70 and the second strain wave gear system 72. The movable bracket 68 is configured to rotate with respect to the support bracket 62 up to an entire 360-degrees, i.e., 0 to 360 degrees. Similarly, the dispensing unit 48 is configured to rotated with respect to the movable bracket 68 up to an entire 360 degrees, i.e., 0 to 360 degrees. Thus, the amount of rotation and tilting of the dispensing head 48 is unrestricted.

Figure 7:
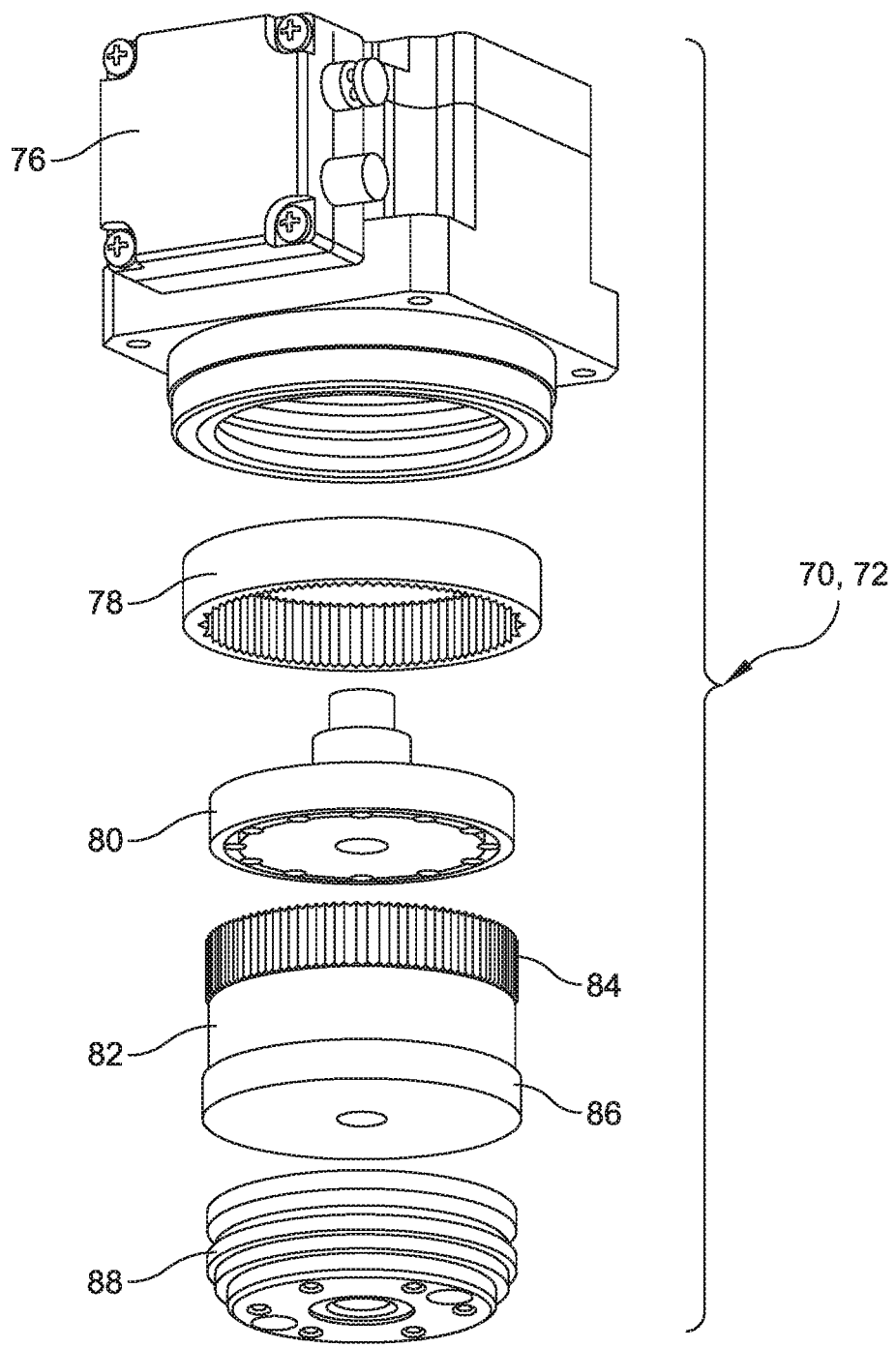
FIG. 7 is an exploded perspective view of a drive assembly of the dispensing system, the drive assembly being configured to tilt and rotate the dispensing unit.
Figure 8:
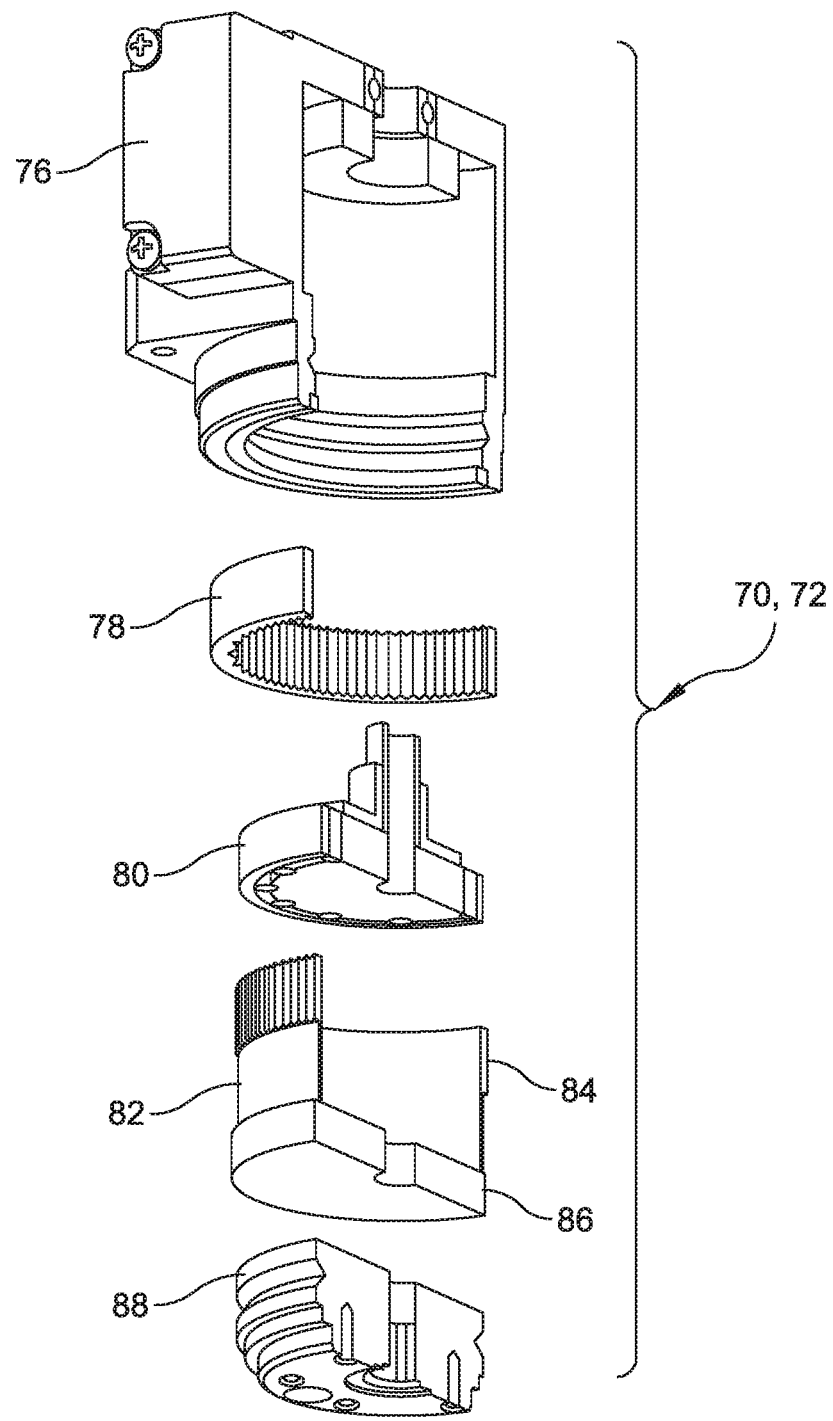
FIG. 8 is an exploded cross-sectional perspective view of the drive assembly shown in FIG. 7.

Referring to FIGS. 7 and 8, the strain wave gear system 70, 72 is illustrated in exploded perspective and cross-sectional views. As mentioned above, the first strain wave gear system 70 and the second strain wave gear system 72 is similarly if not identically constructed. As shown, the strain wave gear system 70, 72 includes a housing 76. For the first strain wave gear system 70, the housing 76 is secured to the second portion 66 of the support bracket 62. For the second strain wave gear system 72, the housing 76 is secured to the movable bracket 68. In one embodiment, the housing 76 of the strain wave gear system 70, 72 is configured to support a motor to drive the rotation of the components of the strain wave gear system and to be coupled to the controller of the dispensing system 40 to control the operation of the strain wave gear system.

Figure 9:
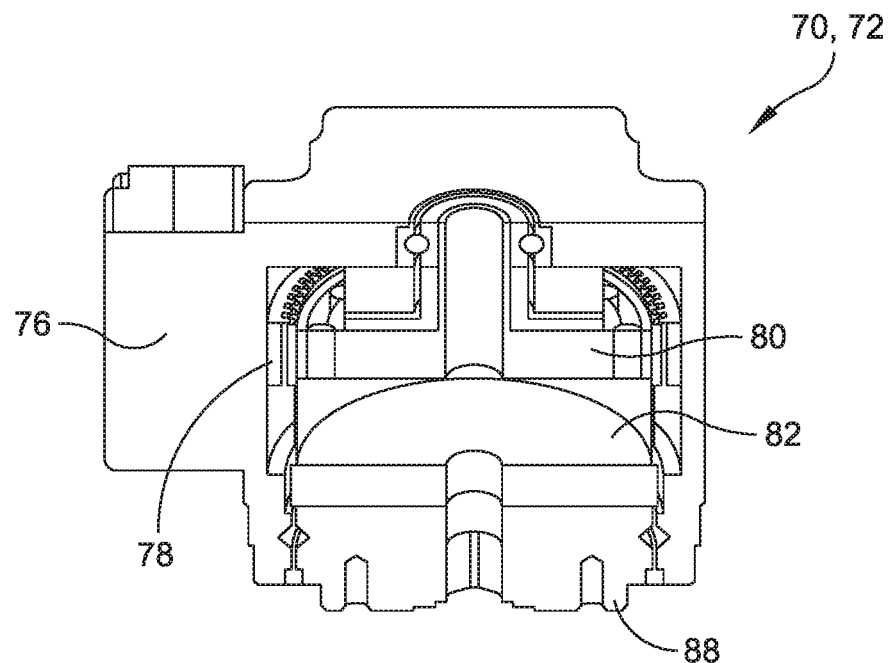
FIG. 9 is an enlarged cross-sectional view of a portion of the drive assembly configured to rotate the dispensing unit.
Figure 10:
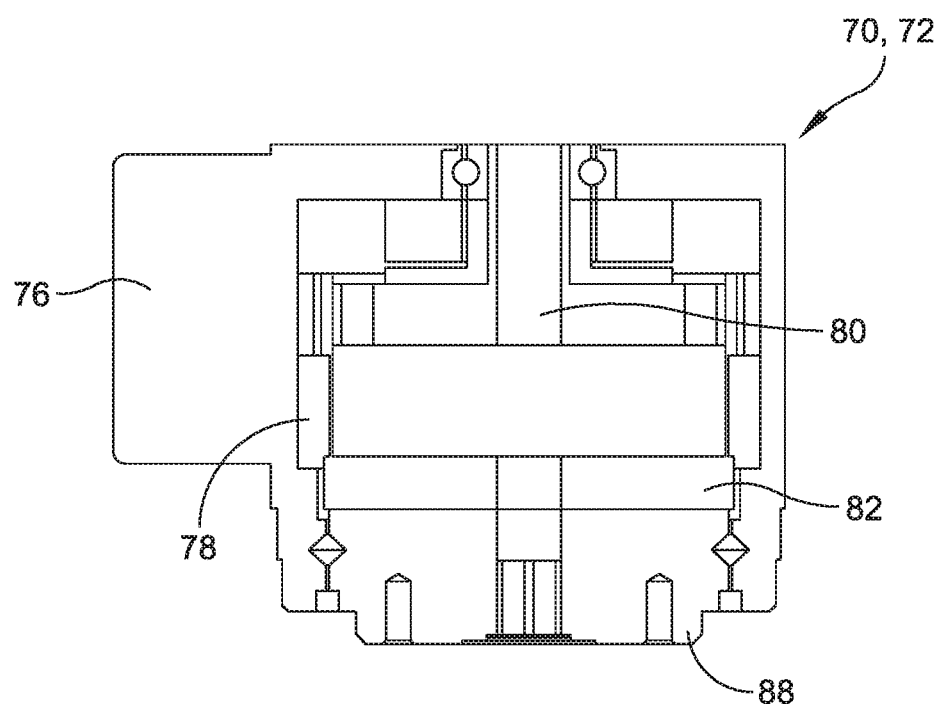
FIG. 10 is an enlarged cross-sectional view of a portion of the drive assembly configured to tilt the dispensing unit.

In one embodiment, the strain wave gear system 70, 72 further includes a circular spine 78 and a wave generator 80 that are both supported by the housing 76, with the wave generator being positioned within the circular spine. The strain wave gear system 70, 72 further includes a flexible spline 82 having a spline portion 84 disposed between the circular spline 78 and the wave generator 80 and a cup-shaped base portion 86 extending from the spline portion. The strain wave gear system 70, 72 further includes a mounting hub 88, which is secured to the base portion 86 of the flexible spline 82. FIGS. 9 and 10 illustrate the component parts of the strain wave gear system 70, 72 assembled together.

Figure 11A:
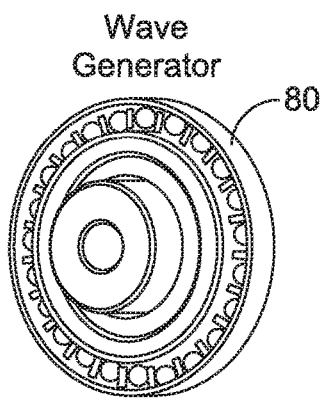
FIG. 11A is a perspective view of a wave generator of the drive assembly.

Referring to FIG. 11A, in one embodiment, the wave generator 80 includes a specially designed, thin raced ball bearing assembly that is fitted onto an elliptical hub. The wave generator 80 serves as a high efficiency torque converter, and is used as an input of the strain wave gear system 70, 72 since the wave generator is coupled to a shaft of a motor provided in the housing 76.

Figure 11B:
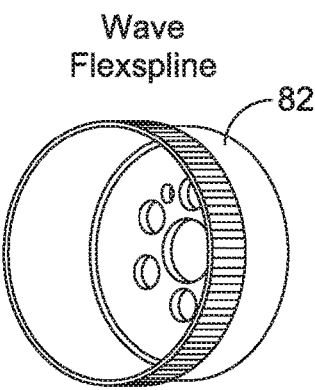
FIG. 11B is a perspective view of a flexible spline of the drive assembly.

Referring to FIG. 11B, in one embodiment, the flexible spline 82 includes a thin cylindrical cup fabricated from alloy steel having external teeth on an open end (spline portion 84) of the cup. The flexible spline 82 is radially compliant but is very stiff in a torsional direction. When the wave generator 80 is inserted into the flexible spline 82, the spline portion 84 of the flexible spline takes on an elliptical shape. The flexible spline 82 is used as an output and is connected to an output flange (base portion 86).

Figure 11C:
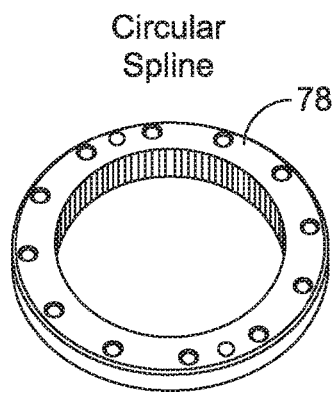
FIG. 11C is a perspective view of a circular spline of the drive assembly.

Referring to FIG. 11C, in one embodiment, the circular spline 78 includes a rigid ring with internal teeth. When the strain wave gear system 70, 72 is assembled, the internal teeth of the circular spline 78 engages the teeth of the spline portion 84 of the flexible spline 82 across a major axis of the strain wave gear system. The circular spline 78 has two more teeth than the number of teeth on the flexible spline 82 and is fixed to the housing 76.

Referring additionally to FIGS. 12A-12D, in one embodiment, the flexible spline 82 is slightly smaller in diameter and has two fewer teeth than the circular spline 78. The elliptical shape of the wave generator 80 causes the teeth of the flexible spline 82 to engage the circular spline 78 at two opposite regions across the major axis of the ellipse. For every 180-degrees of clockwise rotation of the wave generator 80, the teeth of the flexible spline 82 are advanced counterclockwise by one tooth in relation to the circular spline 78. Each complete clockwise rotation of the wave generator 80 results in the flexible spline 82 moving counterclockwise by two teeth from its original position relative to the circular spline 78. Since the gear teeth are always fully engaged in a region along a major axis, there is zero backlash associated with the strain wave gear system 70, 72.

The base portion 86 of the flexible spline 82 is constrained to a circle while the spline portion 84 of the flexible spline is elliptically shaped. This construction causes the teeth of the flexible spline 82 to flare outwards slightly to form a coning angle, which serves as a preload of the outer teeth of the flexible spline and the inner teeth of the circular spline 78. This preload serves to enhance zero backlash of the strain wave gear system 70, 72 to help ensure consistent stability.

Figure 12A:
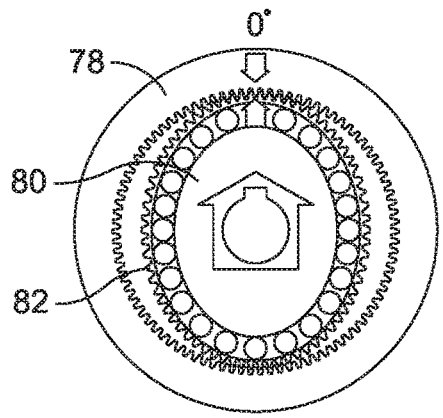
FIGS. 12A-12D are schematic views showing the wave generator and the flexible spline at 0-degree, 90-degree, 180-degree and 360-degree positions, respectively.
Figure 12B:
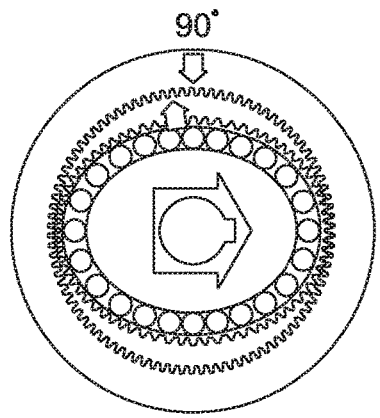
Figure 12C:
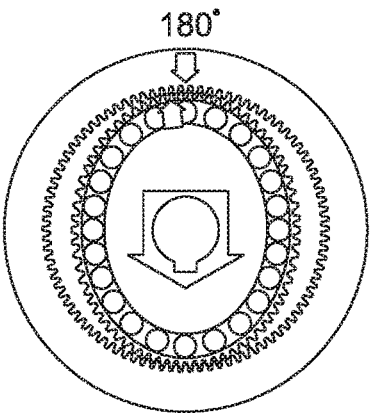
Figure 12D:
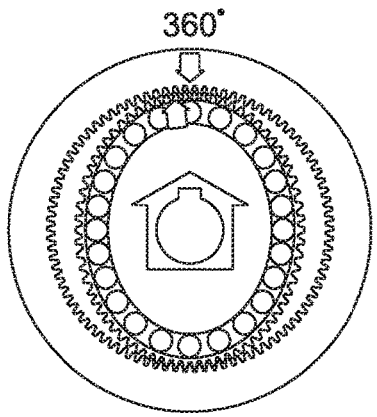

FIG. 12A shows the wave generator 80 and the flexible spline 82 at a 0-degree position with respect to the circular spline 78. FIG. 12B shows the wave generator 80 and the flexible spline 82 at a 90-degree position with respect to the circular spline 78. FIG. 12C shows the wave generator 80 and the flexible spline 82 at a 180-degree position with respect to the circular spline 78. FIG. 12D shows the wave generator 80 and the flexible spline 82 at a 360-degree position with respect to the circular spline 78.

In one embodiment, the controller or control system, such as controller 18, may be configured to have a suitable operating system, with application-specific software to control the operation of the dispensing system 40. In a certain embodiment, an operator of the dispensing system 40 may operate the dispensing system either manually by manipulating a keyboard and a mouse provided with the control system or automatically by preprogramming the control system by means of the keyboard and mouse through the control system. The controller further is configured to analyze at least one image of the electronic substrate 12 to determine positions of the electronic substrate in x-axis, y-axis and theta directions, calculate rotational angles of the electronic substrate, and rotate the dispensing unit 48 to match an angle of the electronic substrate when performing a dispense operation.

During operation, when depositing material on a substrate, such as an electronic, the dispensing unit 48 of the dispensing unit assembly 46 is positioned proximate to the electronic substrate by manipulating the gantry system. The controller controls the automated movement of the dispensing unit 48 by manipulating the gantry system 44 to dispense material on the electronic substrate 12 by rotating the dispensing unit about the A and B axes. The controller, by means of controlling the operation of the gantry system 44 and the drive assembly, controls movement (linear and rotational) of the dispensing unit of the dispensing unit assembly 46.

Thus, it should be observed that the movable bracket 68 is configured to rotate with respect to the support bracket 62 an entire 360-degrees and the dispensing unit 48 is configured to rotated with respect to the movable bracket an entire 360 degrees. This enables the dispensing unit 48 to deposit material on hard-to-reach places on the electronic substrate 12. The dispensing system 40 disclosed herein employs a unique combination of drive assemblies to control a direction of the dispensing unit 48, having the benefit of increased speed and precision of dispensing applications.

As mentioned above, embodiments of the dispensing system may include two dispensing units that can be configured to accurately dispense simultaneously on one or more electronic substrates or two or more patterns associated with a single electronic substrate in a synchronous mode or an asynchronous mode. Specifically, if the electronic substrates are not properly aligned as determined by the controller, the dispensing system can switch from a synchronous mode in which two electronic substrates or patterns are to be dispensed upon to an asynchronous mode in which only one electronic substrate or pattern is dispensed upon. The methods disclosed herein further support the use of various types of dispensing pumps, including, but not limited to, auger, piston and jetting pumps.

An exemplary dispense operation for two substrates or for two substrate patterns may consist of the following steps: delivering a first electronic substrate pattern to a dispense position; delivering a second electronic substrate pattern to a dispense position; aligning the first electronic substrate pattern with a first dispensing unit; positioning the second dispensing unit a predetermined distance from the first dispensing unit; dispensing material from the first dispensing unit at desired locations on the first electronic substrate pattern; and dispensing material from the second dispensing unit at desired locations on the second electronic substrate pattern. In certain embodiments, the step of dispensing material from the first dispensing unit may comprise lowering the first dispensing unit toward the first electronic substrate pattern. Similarly, the step of dispensing material from the second dispensing unit may comprise lowering the second dispensing unit toward the second electronic substrate pattern.

Another exemplary dispense operation may consist of the following steps: delivering first and second electronic substrate patterns to respective dispense positions; positioning a first dispensing unit over the first electronic substrate pattern; positioning a second dispensing unit a predetermined distance from the first dispensing unit; dispensing material from the first dispensing unit at desired locations on the first electronic substrate pattern; and dispensing material from the second dispensing unit at desired locations on the second electronic substrate pattern. Dispensing material from the first dispensing unit comprises lowering the first dispensing unit toward the first electronic substrate pattern. Similarly, dispensing material from the second dispensing unit comprises, lowering the second dispensing unit toward the second electronic substrate pattern. In certain embodiments, the predetermined distance is determined by identifying a first point of reference associated with the first electronic substrate pattern and a second point of reference associated with the second electronic substrate pattern.

Yet another exemplary dispense operation for two substrates may consist of the following steps: (1) calibrating the actual distance between each of the dispensing units and the camera; (2) identifying the actual positions of the fiducial locations on a substrate or on multiple substrates; (3) moving the first dispensing unit to a first dispense location on a first substrate; (4) dispensing at the first dispense location on the first substrate; (5) moving the second dispensing unit to the first dispense location on the second substrate, which is a small and therefore rapidly performed movement; (6) dispensing at the first dispense location on the second substrate; and (7) repeating steps (3) through (6) for each of the remaining dispense locations on the substrates. The foregoing operation may be performed when dispensing on a single substrate having multiple patterns on the substrate.

It is further contemplated that when using more than two dispensing units, that this approach of simultaneous dispensing on every other substrate may be employed. For example, when using three dispensing units, the first, third and fifth substrates may be dispensed upon simultaneously by the first, second and third dispensing units, respectively. After dispensing on these substrates, the dispensing units may be moved so that dispensing occurs on the second, fourth and sixth substrates with the first, second and third dispensing units, respectively.

In an exemplary embodiment, a method of dispensing material may include delivering an electronic substrate to a dispense position, the electronic substrate having at least two identical patterns, acquiring data relative to at least two patterns, determining whether the at least two patterns are properly suited for simultaneous dispensing to perform simultaneous dispense operations on the at least two patterns based on the acquired data, and performing simultaneous dispense operations on the at least two patterns if the two patterns are properly suited for simultaneous dispensing.

Dispensing material may include positioning a first dispensing unit over a first location of a first pattern and positioning a second dispensing unit over a first location of a second pattern. As discussed above, the second dispensing unit may be spaced from the first dispensing unit a predetermined distance. Specifically, material may be dispensed from the first and second dispensing units on respective first locations of the first and second patterns. Once dispensing takes place, the first dispensing unit is moved over a second location of the first pattern and the second dispensing unit is simultaneously moved over a second location of the second pattern of the electronic substrate. Once moved, material may be dispensed from the first and second dispensing units on respective second locations of the first and second patterns.

In another exemplary embodiment, a method of dispensing material may include (1) identifying positions of more than one location on an electronic substrate, (2) determining whether a dispense location of a first pattern and a dispense location of a second pattern are properly suited for simultaneous dispensing to perform simultaneous dispense operations on the first and second patterns based on the identified positions, (3) moving a first dispensing unit to a dispense location on the first pattern and a second dispensing unit to a dispense location on the second pattern, the dispense location of the first pattern corresponding with the dispense location on the second pattern, (4) dispensing at the first dispense location on the first pattern with the first dispensing unit and at the first dispense location on the second pattern with the second dispensing unit, and (5) repeating steps (3) and (4) for each remaining dispense location on the first and second patterns of the electronic substrate. As discussed above, prior to performing the method, a distance between the first dispensing unit and the camera and the distance between the second dispensing unit and the camera may be calibrated.

In one embodiment, to make a static one-time adjustment per substrate presented to the dispenser, the vision system and the controller locates and calculates the distance of one part in a substrate to another part in the same substrate, as well as any rotation of the substrate relative to the gantry system, and adjust the second dispensing unit one time prior to dispensing simultaneously. In another embodiment, an automatic adjustment mechanism may be utilized to make dynamic adjustments while dispensing. Thus, when two patterns are not properly suited for simultaneous dispensing, or in instances in which two substrates are not properly suited for simultaneous dispensing, the method includes simultaneously performing a first dispense operation on the first pattern (or substrate) with the first dispensing unit and performing a second dispense operation on the second pattern (or substrate) with the second dispensing unit. This may be achieved by dynamically positioning the second dispensing unit with the automatic adjustment mechanism while continuing to dispense with the first and second dispensing units.

The dispenser of embodiments of the disclosure is capable of dispensing different patterns simultaneously. In such a method, the gantry carrying the dispensing units, as well as an automatic adjustment mechanism associated with the second dispensing unit (and/or the first dispensing unit), are manipulated to dispense different patterns simultaneously. With this method, lines dispensed by the first dispensing unit and the second dispensing unit may be drawn synchronously.

Accordingly, for a dispenser having multiple dispensing units, the distance and relative position of each of the multiple dispensing units may be configured to match the distance and relative spacing between each of the multiple substrates or components. After collecting and analyzing alignment information from an automatic vision alignment system, a first of the multiple dispensing units is positioned over a first dispense location on the first substrate or component. After performing a dispense operation, the gantry may be manipulated to make any required x-axis and y-axis plane position adjustment that may be necessary to align a second of the multiple dispensing units over the corresponding first dispensing location of the second of the multiple substrates or components. Since the distance and relative position between each of the multiple dispense units is substantially similar to, although not necessarily identical to, the distance and relative position between each of the multiple substrates or components, any such adjustment of the gantry will be very small and thus rapidly performed. Each of the remaining multiple dispense units may be similarly utilized to dispense material at the corresponding first dispense location on each of the remaining substrates or components before any large x-axis and y-axis gantry motion is required. However, if the number of substrates or components is greater than the number of dispense units, then the gantry may need to be repositioned to complete the dispensing operations on all of the substrates. The method is repeated to dispense each of the second and subsequent dispense locations. It should be understood that steps may be interchanged as may be dictated by either throughput or process improvements.

As discussed above, in one embodiment, the dispensing units may be mounted on separate z-axis drive mechanisms. This configuration enables the performance of independent operations when appropriate, including but not limited to dispensing, cleaning (as by an automatic needle/nozzle cleaner, for example), purging and calibration (either the x-axis or y-axis positions or the z-axis position). However, it should be noted that the dispenser may be particularly suited for non-contact dispensing, such as the streaming or jetting of material from the needle/nozzle. When configured for non-contact dispensing, the dispensing operation may be performed with the two (or more) dispensing units that are mounted on a single z-axis drive mechanism.

One embodiment of the present disclosure is directed to a method of dispensing between synchronous and asynchronous modes. As mentioned above, when employing a vision system to determine whether a substrate or multiple substrates are properly suited for simultaneous dispensing, or whether a pattern or multiple patterns are properly suited for simultaneous dispensing, when properly suited for simultaneous dispensing, the substrates or patterns can be synchronously dispensed on by the dispensing units by employing a synchronous mode of operation. However, when not properly suited for simultaneous dispensing, the substrates or patterns can be automatically asynchronously dispensed independently by employing an asynchronous mode of operation.

As used herein, "properly suited for simultaneous dispensing" means that the two or more substrates or patterns are located at known locations as determined by the controller after examining data associated with one or more images taken by the vision system or camera, with such known locations being within a predetermined tolerance, and no other acquired data indicates a reason not to dispense on one or more of the substrates or patterns.

As used herein, "acquired data" means data generated internal to the dispense system, such as vision data or transferred from an external source based on previous processing.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A dispensing system for dispensing viscous material on an electronic substrate, the dispensing system comprising:
   a frame;
   a support coupled to the frame, the support being configured to receive and support an electronic substrate during a dispense operation;
   a dispensing unit assembly configured to dispense viscous material; and
   a gantry coupled to the frame, the gantry being configured to support the dispensing unit assembly and to move the dispensing unit assembly in x-axis and y-axis directions,
   wherein the dispensing unit assembly includes
   a support bracket secured to the gantry,
   a movable bracket rotatably coupled to the support bracket by a first strain wave gear system configured to enable the rotation of the movable bracket with respect to the support bracket about a first axis, and
   a dispensing unit rotatably coupled to the movable bracket by a second strain wave gear system configured to enable the rotation of the dispensing unit with respect to the movable bracket about a second axis generally perpendicular to the first axis,
   wherein each of the first strain wave gear system and the second strain wave gear system includes
   a housing,
   a circular spine supported by the housing,
   a wave generator supported by the housing, the wave generator being positioned within the circular spine,
   a flexible spline having a spline portion disposed between the circular spline and the wave generator and a base portion extending from the spline portion, and
   a mounting hub secured to the base portion of the flexible spline.

2. The dispensing system of claim 1, wherein the movable bracket is configured to rotate with respect to the support bracket up to an entire 360 degrees and the dispensing unit is configured to rotate with respect to the movable bracket up to an entire 360 degrees.

3. The dispensing system of claim 1, wherein the second strain wave gear system includes a mounting plate configured to receive and support the dispensing unit.

4. The dispensing system of claim 1, wherein the support bracket is L-shaped in construction having a first portion coupled to the gantry and a second portion that extends perpendicularly from the first portion.

5. The dispensing system of claim 4, wherein the second portion of the support bracket supports the first strain wave gear system.

6. The dispensing system of claim 4, wherein the gantry includes a beam configured to move in a y-axis direction, and a carriage coupled to the beam, the carriage being configured to move in an x-axis direction.

7. The dispensing system of claim 6, wherein the carriage includes a z-axis drive mechanism, the first portion of the support bracket being secured to the z-axis drive mechanism to provide z-axis movement of the dispensing unit.

8. The dispensing system of claim 1, wherein the housing is configured to support a motor to drive the rotation of the components of the strain wave gear system.

9. The dispensing system of claim 1, wherein the housing of the first strain wave gear system is secured to the second portion of the support bracket and the housing of the second strain wave gear system is secured to the movable bracket.

10. The dispensing system of claim 1, further comprising a vision system coupled to one of the frame and the gantry to capture at least one image of the electronic substrate.

11. The dispensing system of claim 10, further comprising a controller configured to control dispensing unit assembly, the gantry and the vision system to perform a dispense operation on the electronic substrate.

12. The dispensing system of claim 1, wherein the first strain wave gear system and the second strain wave gear system are coupled to a controller of the dispensing system to control the operation of the first and second strain wave gear systems.

13. A method of dispensing viscous material on an electronic substrate with the dispenser of claim 1, the method comprising:

delivering the electronic substrate to the dispense position;
capturing at least one image of the electronic substrate;
analyzing the at least one image of the electronic substrate to determine a position of the electronic substrate; and
performing a dispense operation by rotating the dispensing unit.

* * * * *